(12) United States Patent
Kim

(10) Patent No.: US 7,825,692 B2
(45) Date of Patent: Nov. 2, 2010

(54) SEMICONDUCTOR MEMORY DEVICE AND OUTPUT DRIVE CIRCUIT THEREOF

(75) Inventor: Young-Sik Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 43 days.

(21) Appl. No.: 12/045,471

(22) Filed: Mar. 10, 2008

(65) Prior Publication Data

US 2008/0219079 A1 Sep. 11, 2008

(30) Foreign Application Priority Data

Mar. 8, 2007 (KR) ............... 10-2007-0023114

(51) Int. Cl.
*H03K 19/094* (2006.01)
(52) U.S. Cl. ............... 326/83; 326/86; 327/108
(58) Field of Classification Search ............ 326/56–58, 326/82, 83, 86, 87; 327/108, 109, 110–112
See application file for complete search history.

(56) References Cited

U.S. PATENT DOCUMENTS

| | | | |
|---|---|---|---|
| 6,043,682 A * | 3/2000 | Dabral et al. ............... | 326/86 |
| 2003/0048114 A1 | 3/2003 | Kondoh et al. | |
| 2005/0275986 A1* | 12/2005 | Cho ............... | 361/90 |
| 2006/0119382 A1* | 6/2006 | Shumarayev et al. ......... | 326/33 |
| 2006/0197556 A1 | 9/2006 | Kang et al. | |

FOREIGN PATENT DOCUMENTS

| | | |
|---|---|---|
| JP | 2003-087109 | 3/2003 |
| JP | 2006-246425 | 9/2006 |
| KR | 10-2001-0058511 | 7/2001 |
| KR | 2002-0002513 | 1/2002 |
| KR | 10-2006-0087717 | 8/2006 |
| KR | 10-2006-0096696 | 9/2006 |

OTHER PUBLICATIONS

English language abstract of Korean Publication No. 10-2001-0058511.
English language abstract of Japanese Publication No. 2003-087109.
English language abstract of Korean Publication No. 10-2006-0096696.
English language abstract of Japanese Publication No. 2006-246425.

* cited by examiner

*Primary Examiner*—Rexford N Barnie
*Assistant Examiner*—Jany Tran
(74) *Attorney, Agent, or Firm*—Myers Bigel Sibley & Sajovec, PA

(57) ABSTRACT

An apparatus for supplying current to a semiconductor memory device. A current supply circuit supplies current to an input/output (I/O) drive circuit responsive to a pattern of data input to the I/O drive circuit. The current supply circuit configured to supply current generated by an external voltage to the I/O drive circuit responsive to a first pattern of data input to the I/O drive circuit, and to prevent the current generated by the external voltage from being supplied to the I/O drive circuit responsive to a second pattern of data input to the I/O drive circuit.

14 Claims, 8 Drawing Sheets

US 7,825,692 B2

SEMICONDUCTOR MEMORY DEVICE AND OUTPUT DRIVE CIRCUIT THEREOF

CROSS-REFERENCE TO RELATED APPLICATIONS

This U.S. non-provisional patent application claims priority under 35 U.S.C. §119 of Korean Patent Application No. 10-2007-0023114, filed on Mar. 8, 2007, the entire contents of which are hereby incorporated by reference.

BACKGROUND OF THE INVENTION

The present invention disclosed herein relates to a semiconductor memory device, and an input/output (I/O) drive circuit of the semiconductor memory device.

FIG. 1 illustrates a semiconductor memory device 10. Referring to FIG. 1, the semiconductor memory device 10 includes a plurality of I/O drive circuits DQ0 to DQ6, a plurality of internal voltage generation circuits 11 supplying internal voltages to the I/O drive circuits DQ0 to DQ6, and decoupling capacitors (DECAPs). The DECAPs supply auxiliary operational currents to the I/O drive circuits DQ0 to DQ6 when the voltage levels of input data to the I/O drive circuits DQ0 to DQ6 vary from low to high or from high to low. The internal voltage generation circuits 11 supply main operational currents to the I/O drive circuits DQ0 to DQ6. However, since the internal voltage generation circuits 11 have a slow response time, the operational currents supplied from the internal voltage generation circuits 11 to the I/O drive circuits DQ0 to DQ6 can be temporarily insufficient when the voltage levels of input data to the I/O drive circuits DQ0 to DQ6 are varied. Here, the slow response time of the internal voltage generation circuits 11 means that the internal voltage generation circuits 11 cannot supply sufficient currents. For this reason, the DECAPs are provided to supply auxiliary currents to the I/O drive circuits DQ0 to DQ6.

FIG. 2 illustrates an exemplary structure of an output drive circuit 100 of the I/O drive circuits DQ0 to DQ6 of the semiconductor memory device of FIG. 1. Referring to FIG. 2, the output drive circuit 100 includes a first output circuit 110 and a second output circuit 120. Data are input to the output drive circuit 100 through an input node Q. Then, the data are processed by the first output circuit 110 and the second output circuit 120 and are output from the output drive circuit 100 through an output node OUT. Although the first output circuit 110 outputs the data without a delay, the second output circuit 120 outputs the data after delaying the data for a predefined time so as to prevent distortion of the data in a channel. That is, when the data are transmitted immediately without a delay, reflection waves can increase.

Referring to FIG. 2, the output drive circuit 100 operates as follows. For example, it is assumed that data including a low to high voltage level transition are input to the input node Q. In the first output circuit 110, the data are transmitted to an n-channel metal oxide semiconductor (NMOS) transistor N2 through a first path, and the NMOS transistor N2 is turned on responsive to the data. Inverters 112 and 113 may be disposed along the first path. In the second output circuit 120, the data are transmitted to an n-channel metal oxide semiconductor (NMOS) transistor N4 through a second path, and the NMOS transistor N4 is turned on responsive to the data. A delay circuit 121 and inverters 122 and 123 may be disposed along the second path. The delay circuit 121 may delay the data for a predefined time (e.g., for about 200 ps to about 300 ps). Therefore, the NMOS transistor N4 is turned on a predefined time later after the NMOS transistor N2 is turned on. When a high-level voltage Vg is applied to gates of NMOS transistors N1 and N3, the voltage level of a PAD changes from VTERM to VTERM-(I*RTERM), where I denotes a current at the PAD that is equal to the sum of currents from the NMOS transistors N2 and N4. The amount of the current I may be controlled by the voltage Vg.

When the voltage level of the input node Q of the output drive circuit 100 changes from high to low (or low to high), the DECAPs are used to make up for insufficient current supply. However, in this case, output power noise increases since the voltage levels of the DECAPs are not constant.

Meanwhile, when the voltage level of input data changes from high to low, the output drive circuit 100 operates as follows. In the first output circuit 110, the input data are transmitted to the NMOS transistor N2 through the first path and turn off the NMOS transistor N2. In the second output circuit 120, the input data are transmitted to the NMOS transistor N4 through the second path and turn off the NMOS transistor N4. Here, the input data are delayed for a predefined time when transmitted along the second path to a gate of the NMOS transistor N4 although the input data are not delayed in the first path. Therefore, the NMOS transistor N4 is turned off a predefined time later after the NMOS transistor N2 is turned off. Here, the voltage level of the PAD is VTERM. Even though an even number of inverters are shown in the first output circuit (e.g., 112 and 113) and an even number of inverters are shown in the second output circuit (e.g., 122 and 123), if an odd number of inverters are used, the same problem can occur on a transition of the input data in the opposite direction.

SUMMARY OF THE INVENTION

Example embodiments of the present invention provides a semiconductor memory device having a low output power noise level, an output drive circuit of the semiconductor memory device, and a current supply method for the semiconductor memory device and the output drive circuit.

Some example embodiments of the present invention provide methods for supplying a current to a semiconductor memory device including an output drive circuit and a current supply circuit, the method including: inputting data to the output drive circuit; and supplying a current from the current supply circuit to the output drive circuit in a manner dependent on a pattern of the data input to the output drive circuit.

In some embodiments, the current may include a current generated by an internal voltage and a current generated by an external voltage.

In other embodiments, when the data input to the output drive circuit changes from a low level to a high level, the output drive circuit may receive the current generated by the external voltage.

In still other embodiments, when the data input to the output drive circuit changes from a high level to a low level, or remains at a constant level, the output drive circuit may prevent the current generated by the external voltage from being supplied to the output drive circuit, and may receive a current generated by an internal voltage generation circuit.

In even other embodiments, when the data input to the output drive circuit changes from a low level to a high level, the output drive circuit may receive the current generated by the external voltage for a predefined time.

In some embodiments, if an odd number of inverters are used between a data input node and a data output node, a circuit may be configured to perform an opposite operation. In this case, when the data input to the output drive circuit changes from a high level to a low level, the output drive circuit may receive the current generated by the external voltage. And when the data input to the output drive circuit changes from a low level to a high level, or remains at a constant level, the output drive circuit may prevent the current generated by the external voltage from being supplied to the output drive circuit, and may receive a current generated by an internal voltage generation circuit.

In yet other embodiments, the output drive circuit may include a short pulse generator to output a short pulse corresponding to the predefined time.

In other embodiments of the present invention, semiconductor memory devices include: an output drive circuit; and a current supply circuit to supply a current generated by an external voltage to the output drive circuit or to prevent the current generated by the external voltage from being supplied to the output drive circuit according to a pattern of data input to the output drive circuit.

In some embodiments, when the data input to the output drive circuit has a constant level, the current supply circuit may prevent the current generated by the external voltage from being supplied to the output drive circuit.

In other embodiments, when the data input to the output drive circuit has a constant level, the output drive circuit may receive a current generated by an internal voltage generation circuit.

In still other embodiments, when the data input to the output drive circuit changes from a high level to a low level or from a low level to a high level, the current supply circuit may supply the current generated by the external voltage to the output drive circuit.

In some embodiments, if an odd number of inverters are used between a data input node and a data output node, a circuit may be configured to perform an opposite operation. In this case, when the data input to the output drive circuit changes from a high level to a low level, the output drive circuit may receive the current generated by the external voltage. And when the data input to the output drive circuit changes from a low level to a high level, or remains at a constant level, the output drive circuit may prevent the current generated by the external voltage from being supplied to the output drive circuit, and may receive a current generated by an internal voltage generation circuit.

In even other embodiments, the output drive circuit may include a pulse generation circuit to generate a pulse for a predefined time when the data input to the output drive circuit changes from a high level to a low level or from a low level to a high level. The current supply circuit may be operable depending on the pulse generated by the pulse generation circuit.

In yet other embodiments, the pulse generation circuit may include: a short pulse generation circuit to generate a short pulse when the data input to the output drive circuit changes from a high level to a low level or from a low level to a high level; and a level shift circuit to change a voltage level of the short pulse into a form suitable for operating the current supply circuit.

In further embodiments, the output drive circuit may receive an internal voltage through a power node, and the current supply circuit may supply a current to the power node.

In still further embodiments, the semiconductor memory device may further include a decoupling capacitor (DECAP) between the power node and ground.

In even further embodiments, the current supply circuit may include a p-channel metal oxide semiconductor (PMOS) transistor, and the PMOS transistor may include a source coupled to the external voltage, a drain coupled to the ground, and a gate receiving the pulse.

In still other embodiments of the present invention, semiconductor memory devices may include: an output drive circuit; and a current supply circuit to supply a current generated by an external voltage to the output drive circuit or to prevent the current generated by the external voltage from being supplied to the output drive circuit according to a pattern of data input to the output drive circuit.

In some embodiments, when the data input to the output drive circuit has a constant level, the current supply circuit may prevent the current generated by the external voltage from being supplied to the output drive circuit.

In other embodiments, when the data input to the output drive circuit has a constant level, the output drive circuit may receive a current generated by an internal voltage generation circuit.

In still other embodiments, when the data input to the output drive circuit changes from a low level to a high level, the current supply circuit may supply the current generated by the external voltage to the output drive circuit.

In even other embodiments, the output drive circuit may include a pulse generation circuit to generate a pulse for a predefined time when the data input to the output drive circuit changes from a low level to a high level. The current supply circuit is operable depending on the pulse generated by the pulse generation circuit.

In yet other embodiments, the pulse generation circuit may include: a short pulse generation circuit to generate a short pulse when the data input to the output drive circuit changes from a low level to a high level; and a level shift circuit to change a voltage level of the short pulse into a form suitable for operating the current supply circuit.

In further embodiments, the output drive circuit may receive an internal voltage through a power node, and the current supply circuit may supply a current to the power node.

In still further embodiments, the semiconductor memory device may further include a decoupling capacitor between the power node and ground.

In even further embodiments, the current supply circuit may include a PMOS transistor, and the PMOS transistor may include a source coupled to the external voltage, a drain coupled to the power node, and a gate configured to receive the short pulse.

In even other embodiments of the present invention, there are provided output drive circuits of semiconductor memory devices, the output drive circuits including: an output circuit to receive data input from an input node and to output the data to an output pad; and a current control circuit to control current supply to the output circuit in a manner dependent on a pattern of the data input to the output circuit.

In some embodiments, when the data input to the output circuit has a constant level, the output circuit may receive a current generated by an internal voltage.

In other embodiments, when the data input to the output circuit changes from a high level to a low level, the output circuit may receive a current generated by an internal voltage.

In still other embodiments, when the data input to the output circuit changes from a low level to a high level, the output circuit may receive a current generated by an external voltage.

In even other embodiments, the output circuit may receive an internal voltage through a power node and a current generated by the external voltage through the power node.

In yet other embodiments, the output drive circuit may further include a decoupling capacitor between the power node and ground.

In further embodiments, the current control circuit may include a short pulse generation circuit to output a short pulse when the data input to the output circuit changes from a low level to a high level, and the output circuit may receive the current generated by the external voltage responsive to the short pulse.

In still further embodiments, the short pulse generation circuit may include: an inverter inverting the data input from the input node; and a NAND gate receiving the data input from the input node and data output from the inverter for an NAND operation.

In even further embodiments, the output circuit may include: a first output circuit to receive the data input from the input node and to output the data to the output pad; and a second output circuit to receive the data input from the input node and to output the data to the output pad after delaying the data for a predefined time.

In yet further embodiments, the first and second output circuits may share the current control circuit.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

The present invention provides a semiconductor memory device, an input/output (I/O) drive circuit of the semiconductor memory device, and a current supply method for the semiconductor memory device and the I/O drive circuit. According to the present invention, currents can be supplied in different manners according to the pattern of input data. For example, when a large amount of current is instantaneously required, a current generated by an external voltage may be used. Therefore, output power noise can be reduced when the voltage level of input data changes from low to high.

Figure 3:
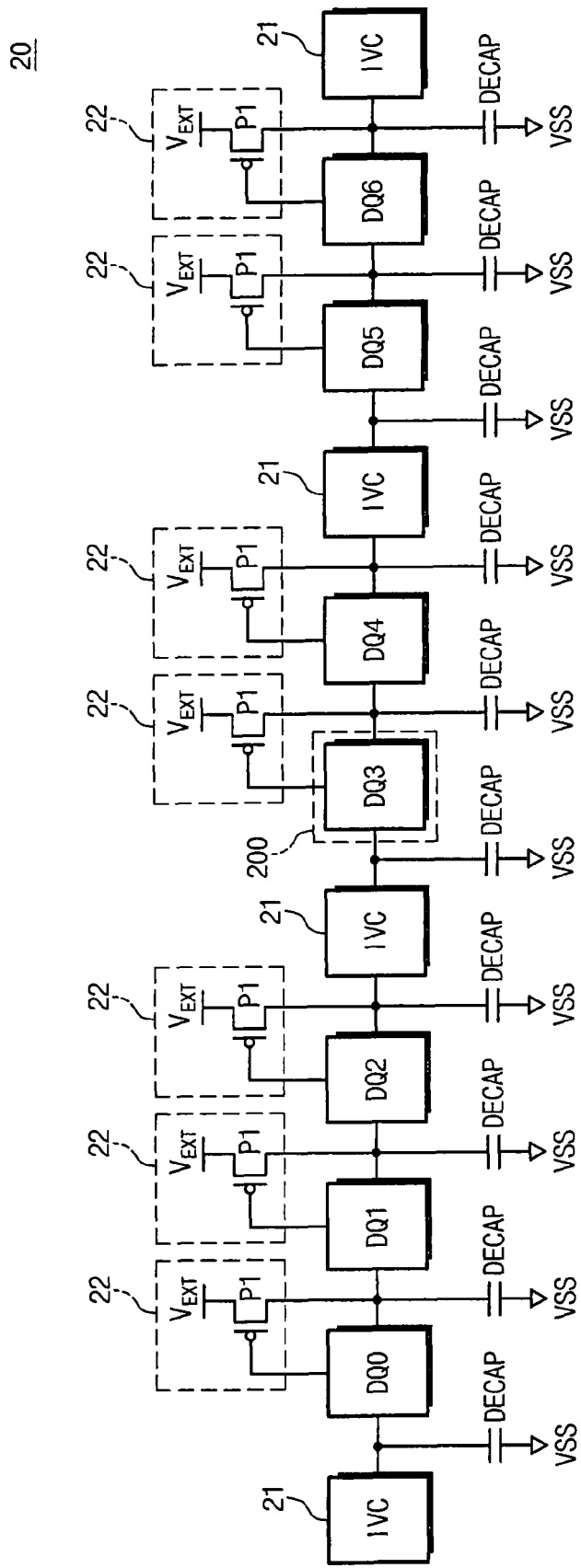
FIG. 3 illustrates a semiconductor memory device according to an embodiment of the present invention.

FIG. 3 illustrates a semiconductor memory device 20 according to an embodiment of the present invention. Referring to FIG. 3, the semiconductor memory device 20 may include I/O drive circuits DQ0 to DQ6, internal voltage generation circuits 21 supplying internal voltages to the I/O drive circuits DQ0 to DQ6, current supply circuits 22 supplying currents to the I/O drive circuits DQ0 to DQ6 according to the pattern of data, and decoupling capacitors (DECAPs).

In the current embodiment, currents may be supplied to the I/O drive circuits DQ0 to DQ6 in different manners according to the pattern of data. For example, when the pattern of I/O data varies, the I/O drive circuits DQ0 to DQ6 receive currents from the current supply circuits 22. On the other hand, when the pattern of I/O data does not vary, the I/O drive circuits DQ0 to DQ6 receive currents from the internal voltage generation circuits 21 and the DECAPs. As shown in FIG. 3, an external voltage $V_{EXT}$ can be applied to the current supply circuits 22 so as to allow current supply from the current supply circuits 22 to the I/O drive circuits DQ0 to DQ6.

The DECAPs can function as filters for removing noise from a supplied voltage. The DECAPs may be disposed between the internal voltage generation circuits 21 and the I/O drive circuits DQ0 to DQ6 and are coupled between power supply lines and ground lines VSS. Meanwhile, the DECAPs can supply currents to the I/O drive circuits DQ0 to DQ6.

As the integration level of semiconductor memory devices such as direct random access memories (DRAMs) increases, the capacity and operating speed of the semiconductor memory devices may also be improved. In general, when the integration level of semiconductor memory device increases, the number of operation circuits increases in proportion to the increase of the integration level, and intensive fluctuation noise can be momentarily generated in power and ground voltages VDD and VSS during read and write operations. For this reason, DECAPs can be disposed in a semiconductor memory device to remove noises from operational power voltages such as power voltages VDD and ground voltages VSS.

In the semiconductor memory device 20 of the current embodiment, currents may be supplied to the I/O drive circuits DQ0 to DQ6 in different manners according to the pattern of data. For example, when the voltage level of data changes, the I/O drive circuits DQ0 to DQ6 may receive currents generated by the external voltage $V_{EXT}$. Therefore, since the I/O drive circuits DQ0 to DQ6 do not receive currents from the DECAPs when the voltage level of data changes, output power noises can be reduced.

Figure 4:
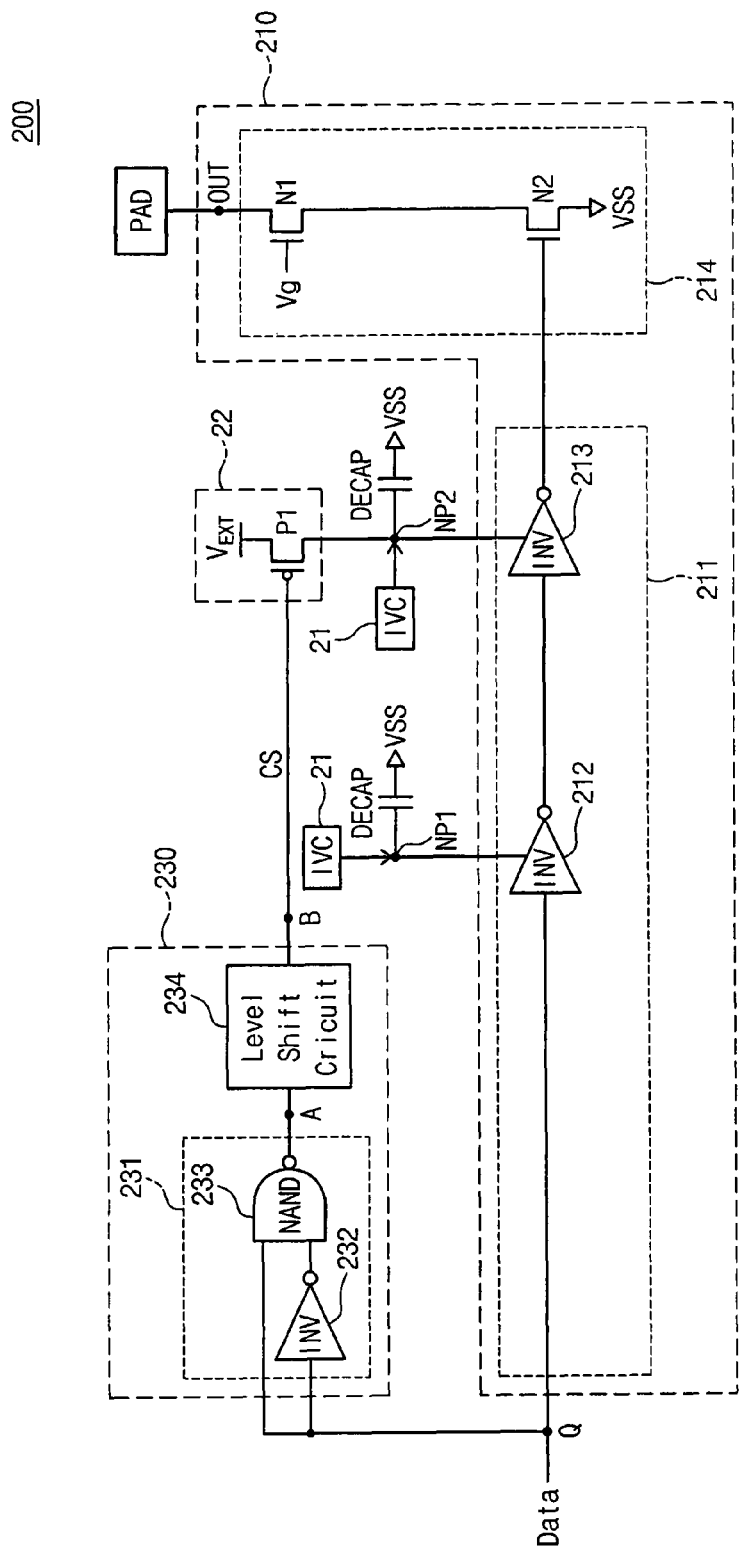
FIG. 4 illustrates an output drive circuit of I/O drive circuits of the semiconductor memory device of FIG. 3 according to an embodiment of the present invention.

FIG. 4 illustrates an output drive circuit 200 of I/O drive circuits DQ0 to DQ6 of the semiconductor memory device 20 of FIG. 3. Referring to FIG. 4, the output drive circuit 200 includes an output circuit 210 and a current control circuit 230. The current control circuit 230 generates a current control signal CS so as to control current supply to the output circuit 210 according to the pattern of input data. Specifically, as shown in FIG. 4, the current supply circuit 22 may operate responsive to the current control signal CS generated from the current control circuit 230 according to the pattern of input data.

The current supply circuit 22 may be a p-channel metal oxide semiconductor (PMOS) transistor P1. The PMOS transistor P1 may include a source coupled to an external voltage $V_{EXT}$, a drain coupled to a power node NP2, and a gate receiving a current control signal CS. Therefore, the PMOS transistor P1 can be turned on or off according to the current control signal CS.

The output circuit 210 may receive data through an input node Q and may output the data through an output node OUT. The output node OUT may be coupled to a PAD. The output circuit 210 may include a free output circuit 211 and a main output circuit 214.

The free output circuit 211 may include a first inverter 212 and a second inverter 213 that are coupled in series. Data input through the input node Q is inverted by the first inverter 212 and then is inverted again by the second inverter 213. Thereafter, the data is transmitted to the main output circuit 214.

The main output circuit 214 may include a first NMOS transistor N1 and a second NMOS transistor N2. The first NMOS transistor N1 includes a drain coupled to the output node OUT and a gate coupled to a gate voltage Vg. The second NMOS transistor N2 includes a drain coupled to a source of the first NMOS transistor N1, a source coupled to a ground voltage VSS, and a gate to receive data output from the free output circuit 211. Therefore, when the gate voltage Vg and the data input from the free output circuit 211 are high, the main output circuit 214 is turned on.

The first and second NMOS transistors N1 and N2 of the main output circuit 214 may be much larger than transistors of the free output circuit 211. Therefore, when the level of input data varies from low to high, the main output circuit 214 requires a relatively large amount of current as compared with the amount of current required by the free output circuit 211.

Figure 2:
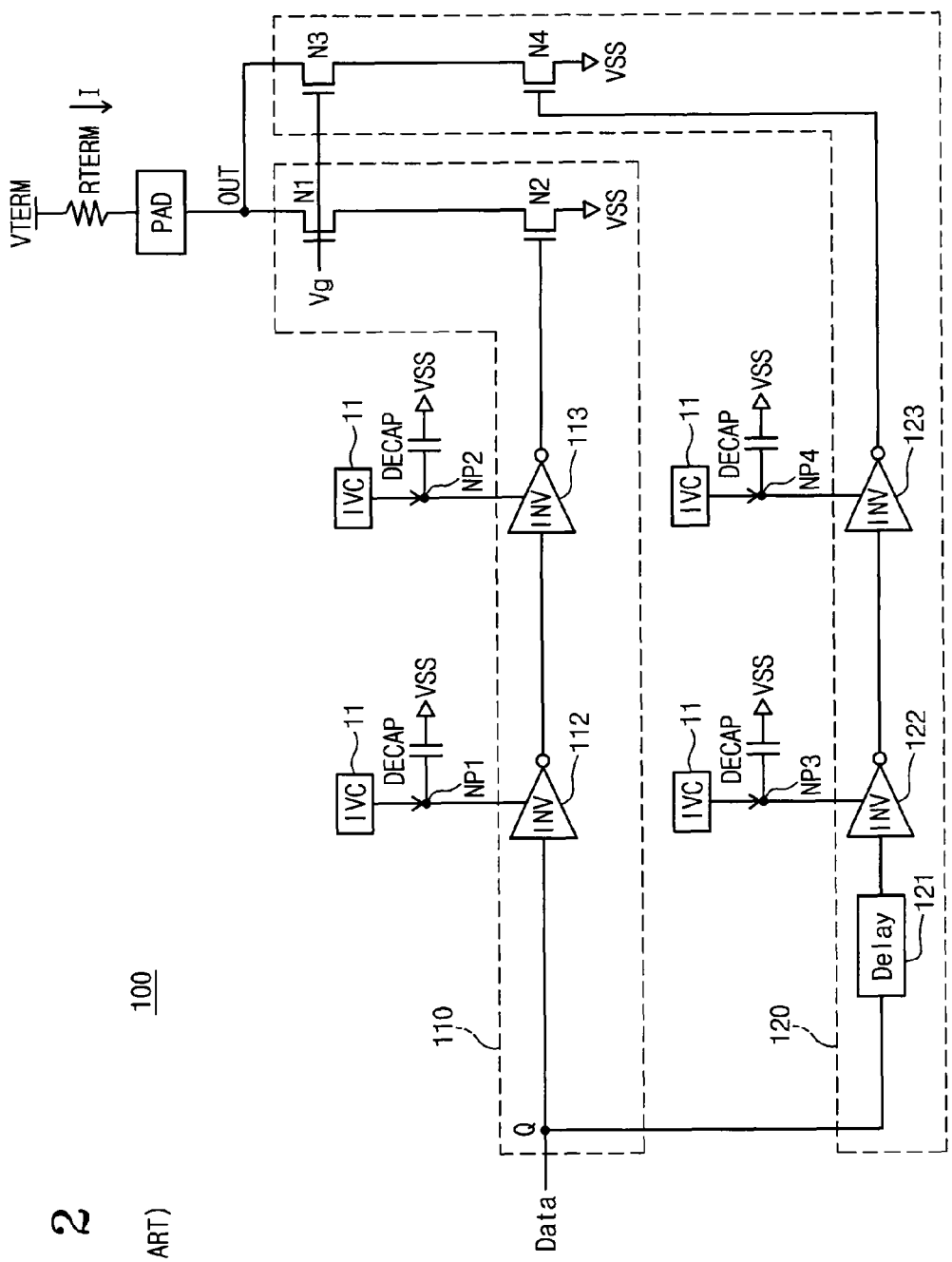
FIG. 2 illustrates an exemplary structure of an output drive circuit of input/output (I/O) drive circuits of the semiconductor memory device of FIG. 1.

In a typical output circuit such as the first output circuit 110 shown in FIG. 2, when the level of a gate voltage of the NMOS transistor N2 changes from low to high, a required current is supplied by the internal voltage generation circuit 11 and the DECAP. In this case, since a large amount of current is instantaneously supplied from the DECAP, output power noise can increase.

However, in the output circuit 210 of the current embodiment, when the level of a gate voltage of the second NMOS transistor N2 changes from low to high, a required current is mainly supplied by the current supply circuit 22. Therefore, a large amount of current is not instantaneously supplied from the DECAP. Thus, output power noise can decrease.

The current control circuit 230 detects the pattern of data input through the input node Q and controls the current supply circuit 22. Particularly, when the current control circuit 230 detects that the pattern of the data changes from low to high, the current control circuit 230 turns on the PMOS transistor P1 of the current supply circuit 22 for a predefined time. The current control circuit 230 includes a short pulse generation circuit 231 and a level shift circuit 234. The short pulse generation circuit 231 generates a short pulse responsive to input data. A width of the generated short pulse may substantially correspond to a delay time of the inverter 232. The level shift circuit 234 changes the level of an output voltage of the short pulse generation circuit 231 into a form suitable for the current supply circuit 22 to which an external voltage $V_{EXT}$ is applied.

The short pulse generation circuit 231 includes an inverter 232 and a NAND gate 233. In the embodiment of FIG. 4, it is assumed that an output of the inverter 232 is delayed for a predefined time. The inverter 232 is coupled to the input node Q and inverts data input through the input node Q. The NAND gate 233 receives the output data of the inverter 232 and the data input through the input node Q for NAND logic operation.

The short pulse generation circuit 231 operates in three ways as follows.

First, when data having a constant level are input through the input node Q, the NAND gate 233 receives inputs having different levels from the input node Q and the inverter 232 and generates a high-level output. That is, in this case, the short pulse generation circuit 231 outputs a high-level signal.

Second, when the level of data input through the input node Q changes from high to low, the inverter 232 outputs low-level data to the NAND gate 233 for a predefined time by inverting high-level data. Thus, the NAND gate 233 receives low-level data from the input node Q and the inverter 232 and outputs a high-level signal. That is, in this case, the short pulse generation circuit 231 outputs a high-level signal. Also, another short pulse generation circuit (not shown) can be applied to the I/O Drive circuit and generate a pulse when data changes from a high to low level.

Third, when the level of data input through the input node Q changes from low to high the inverter 232 outputs high-level data to the NAND gate 233 for a predefined time by inverting low-level data. Thus, the NAND gate 233 receives high-level data from both the input node Q and the inverter 232 and outputs a low-level signal. That is, in this case, the short pulse generation circuit 231 outputs a low-level signal for a predefined time.

Figure 5:
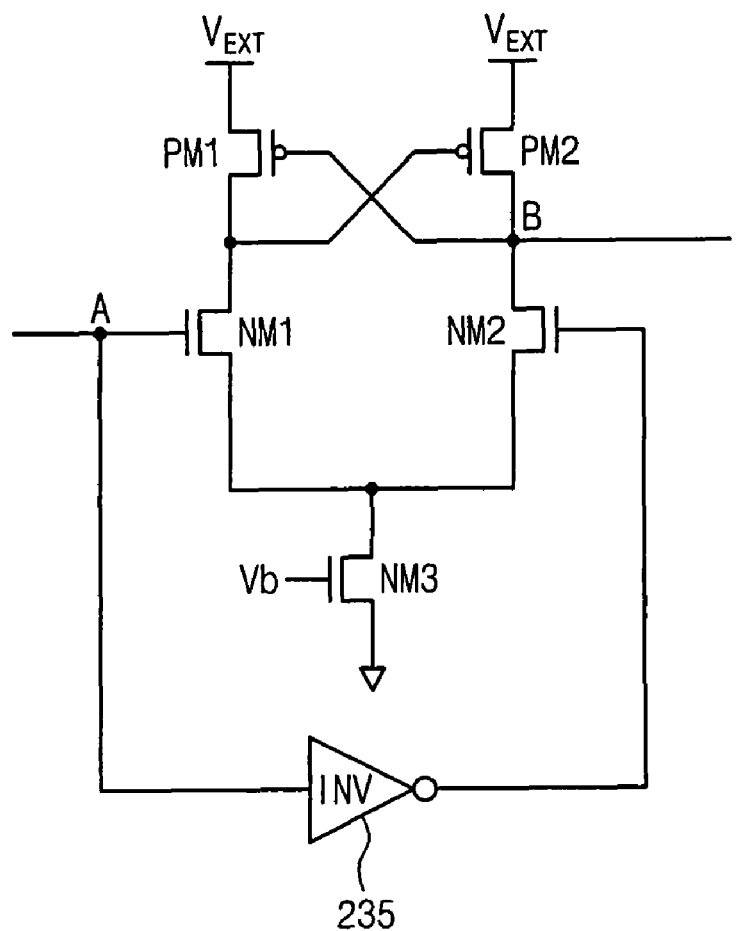
FIG. 5 illustrates a level shift circuit according to an embodiment of the present invention.

The level shift circuit 234 changes the voltage level of an output of the short pulse generation circuit 231 into a form suitable for the PMOS transistor P1 of the current supply circuit 22 to which an external voltage $V_{EXT}$ is applied. For example, when the short pulse generation circuit 231 outputs a 1.8-V signal, the level shift circuit 234 changes the signal from 1.8 V to 2.5 V. FIG. 5 illustrates an exemplary structure of the level shift circuit 234 according to an embodiment of the present invention. The voltage level of a node A is converted into the voltage level of a node B by the level shift circuit 234. The voltage level of the node A is a voltage level depending on an internal voltage level, and the voltage level of the node B is a voltage level depending on an external voltage level $V_{EXT}$.

When the level of data input through the input node Q changes from low to high, the current control circuit 230 outputs a low-level control signal CS for a predefined time. Therefore, the PMOS transistor P1 of the current supply circuit 22 is turned on responsive to the low-level control signal CS. Therefore, when the level of data input to the output drive circuit 200 changes from low to high, the output drive circuit 200 receives a current generated by the external voltage $V_{EXT}$.

In other cases, that is, when the level of data input to the output drive circuit 200 is constant or changes from high to low, the current control circuit 230 generates a high-level control signal CS. Therefore, the PMOS transistor P1 of the current supply circuit 22 is turned off responsive to the high-level control signal CS. As a result, the output drive circuit 200 does not receive a current generated by the external voltage $V_{EXT}$.

Figure 6:
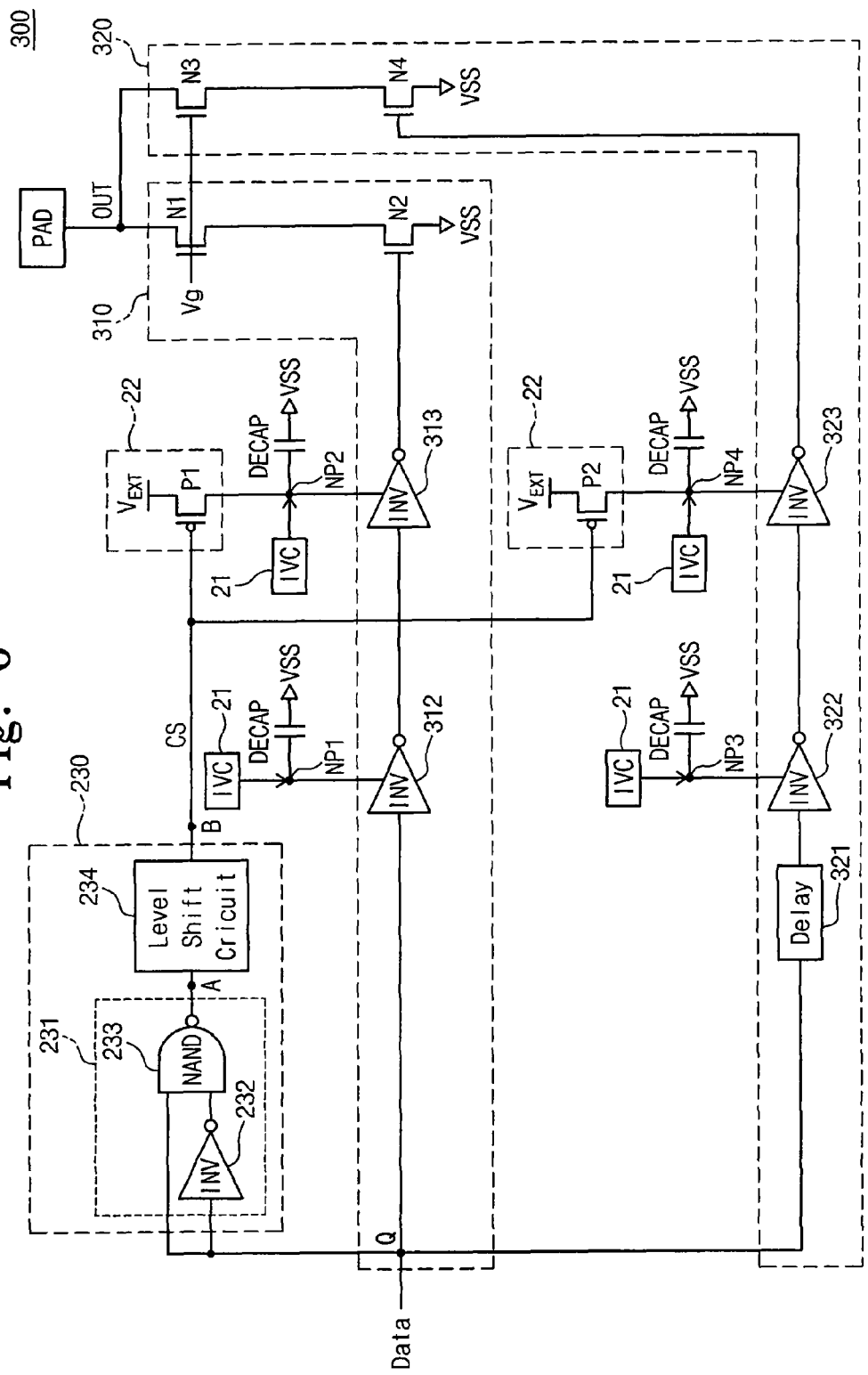
FIG. 6 illustrates an output drive circuit according to another embodiment of the present invention.

FIG. 6 illustrates an output drive circuit 300 according to another embodiment of the present invention. Referring to FIG. 6, the output drive circuit 300 includes a first output circuit 310 and a second output circuit 320. Here, the output of the second output circuit 320 may be delayed for a predefined time using delay circuit 321, whereas the output of the first output circuit 310 is not delayed in this manner.

The first output circuit 310 may have substantially the same structure as that of the output circuit 210 illustrated in FIG. 4. The second output circuit 320 may have substantially the same structure as the first output circuit 310, except for the delay circuit 321.

When the output drive circuit 300 receives data through an input node Q and outputs the data through an output node OUT, the delay circuit 321 of the second output circuit 320 of the output drive circuit 300 delays the data. Thereafter, the voltage level of the output node OUT is transmitted external to the output drive circuit 300 through a PAD.

In the embodiment shown in FIG. 6, the first and second output circuits 310 and 320 may share a current control circuit 230. However, separate current control circuits can be coupled to the first and second output circuits 310 and 320, respectively.

Figure 1:
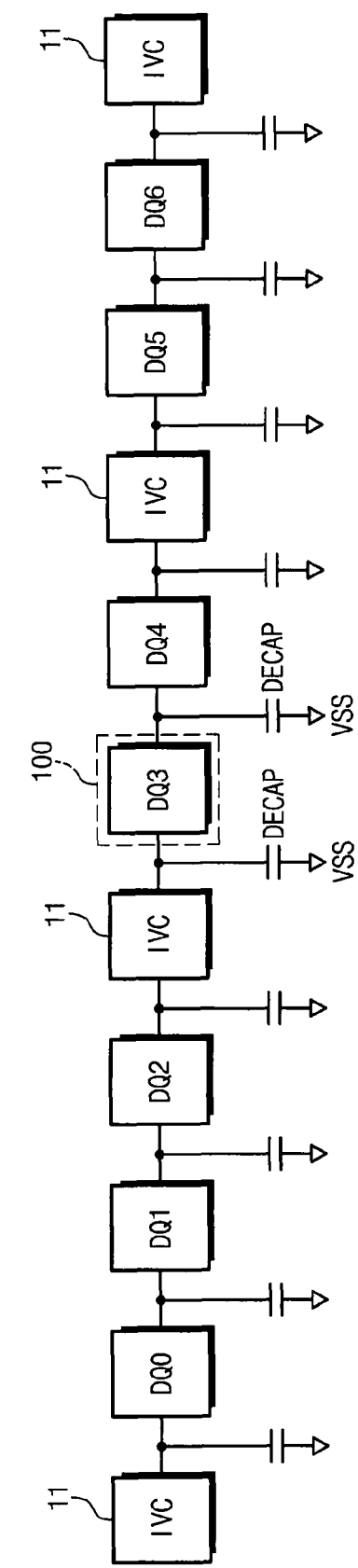
FIG. 1 illustrates a semiconductor memory device.
Figure 7:
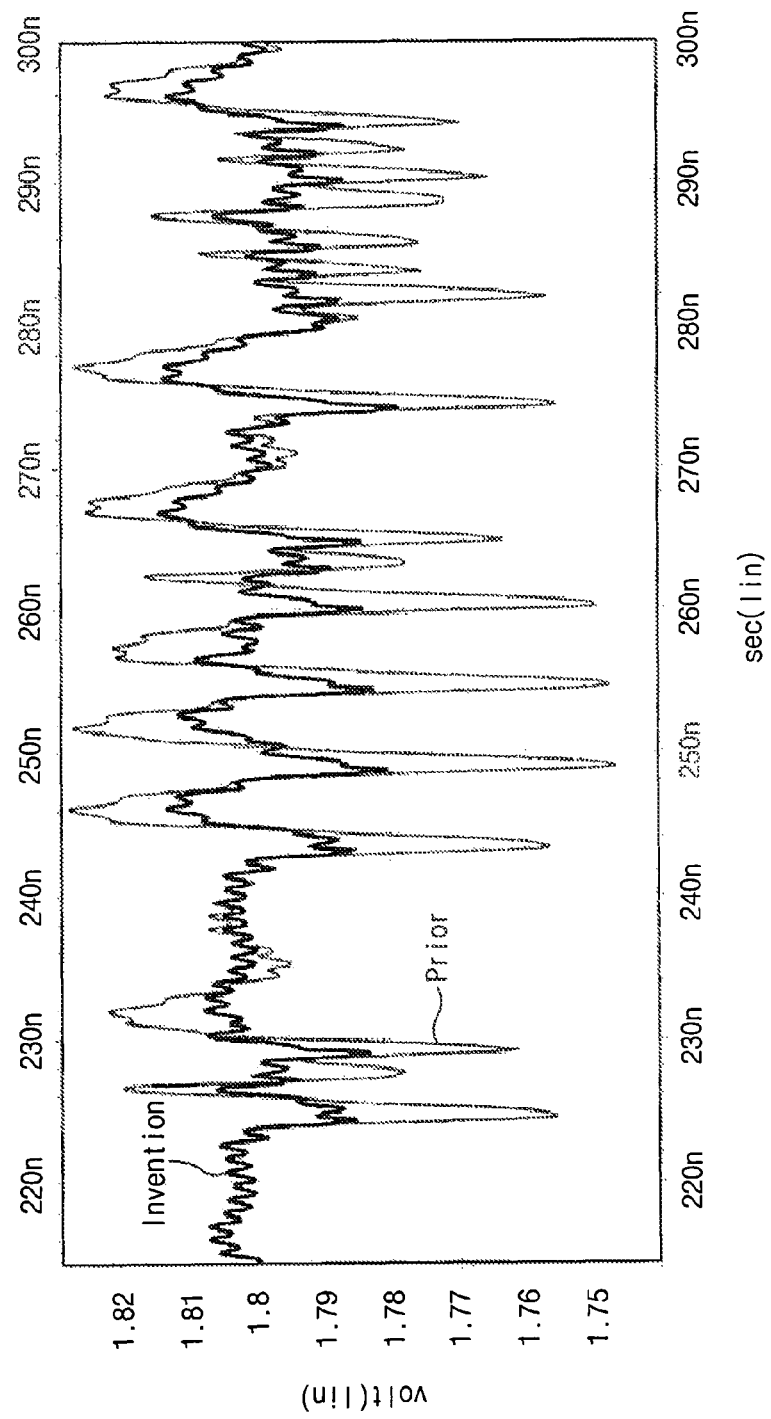
FIG. 7 illustrates output power noise simulation results of an output drive circuit of the present invention.

FIG. 7 illustrates output power noise simulation results of the output drive circuit 300. The horizontal axis shows time on a linear scale in increments of 10 nanoseconds. The vertical axis shows voltage on a linear scale in increments of 0.01 V. The output drive circuit 100 of FIG. 1 has an output power noise level in the range from about −53 mV to about 28 mV. However, the output drive circuit 300 of the current embodiment has an output power noise level in the range from about −25 mV to about 17 mV. According to the current embodiment of the present invention, the output power noise level of the output drive circuit 300 is drastically reduced as shown in FIG. 7.

Figure 8:
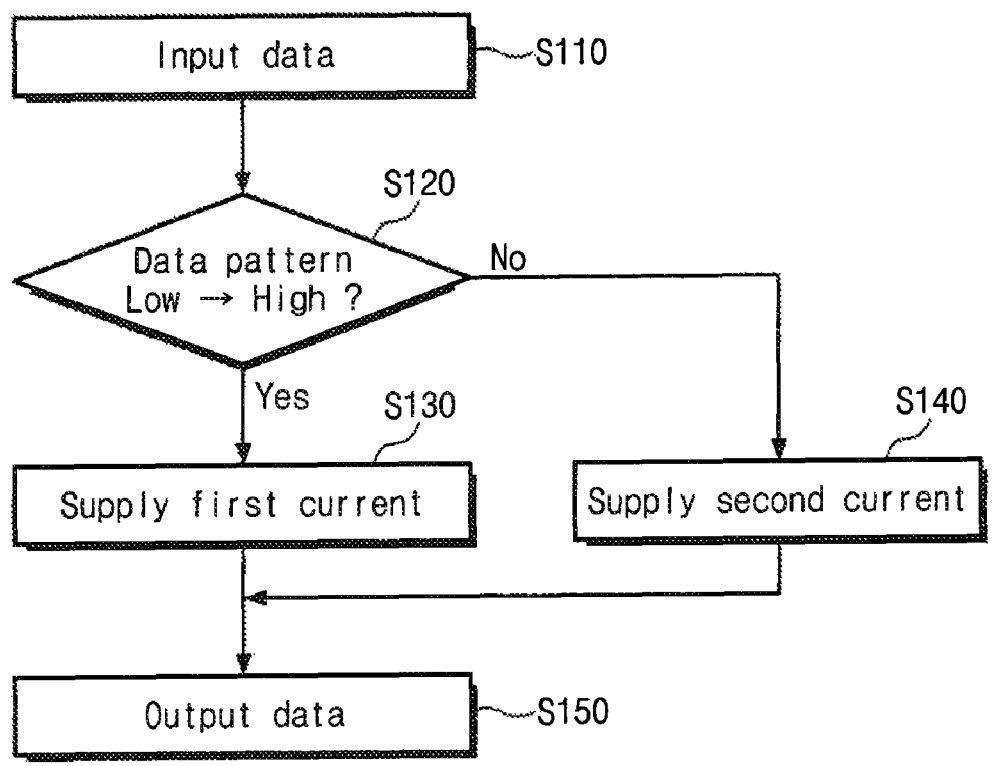
FIG. 8 illustrates a method for supplying a current when an output drive circuit outputs data according to an embodiment of the present invention.

FIG. 8 illustrates a method for supplying a current when the output drive circuit 300 outputs data according to an embodiment of the present invention. Referring to FIG. 8, when the output drive circuit 300 outputs data, a current is supplied to the output drive circuit 300 as follows.

In operation S110, data is input to the output drive circuit 300 through the input node Q. The data input to the output drive circuit 300 can be classified according to the voltage level of the data into three types. First, the voltage level of the data can be constant. Secondly, the voltage level of the data can change from high to low. Thirdly, the voltage level of the data can change from low to high.

In operation S120, it is determined whether the pattern of the data changes from a low level to a high level. The current control circuit 230 detects the pattern of the data and generates a corresponding control signal CS. Specifically, if the pattern of the data changes from a low level to a high level, the current control circuit 230 generates a low-level control signal CS for a predefined time. In other cases, the current control circuit 230 generates a high-level control signal CS.

In operation S130, if the pattern of the data changes from a low level to a high level, the PMOS transistor P1 of the current supply circuit 22 is turned on responsive to the low-level control signal CS. Thus, the first and second output circuits 310 and 320 can receive a current from the current supply circuit 22. Here, the current supplied to the first and second output circuits 310 and 320 is a current generated by an external voltage $V_{EXT}$.

In operation S140, if the pattern of the data does not change from a low level to a high level, the PMOS transistor P1 of the current supply circuit 22 is turned off responsive to the high-level control signal CS. In this case, the first and second output circuits 310 and 320 receive a current from the internal voltage generation circuit 21 and the DECAP.

In operation S150, data are output from the first and second output circuits 310 and 320 of the output drive circuit 300 with a delay by the delay circuit 321. According to the current supply method of the current embodiment, a current is supplied to the output drive circuit 300 in different ways based on the pattern of data input to the output drive circuit 300. For example, when the data input to the output drive circuit 300 changes from low to high, a current generated by an external voltage $V_{EXT}$ is supplied to the output drive circuit 300.

According to some example embodiments of the present invention, when the voltage level of the input node of the I/O drive circuit changes from low to high, a short pulse is generated, and a current generated by an external voltage responsive to the short pulse is supplied to the I/O drive circuit.

According to some example embodiments of the invention including the current supply method for the semiconductor memory device and the I/O drive circuit, a current is supplied to the I/O drive circuit in different manners according to the pattern of data input to the I/O drive circuit.

Therefore, according to the present invention, the output power noise level of the I/O drive circuit and the semiconductor memory device can be reduced. As described above, according to example embodiments of the present invention, output power noise can be reduced owing to the data pattern dependent current supply method.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor memory device comprising:
   an I/O drive circuit; and
   a current supply circuit configured to supply current generated by an external voltage to the I/O drive circuit responsive to a first pattern of data input to the I/O drive circuit, and to prevent the current generated by the external voltage from being supplied to the I/O drive circuit responsive to a second pattern of data input to the I/O drive circuit,
   wherein the first pattern of data includes a change from a low level to a high level, and
   wherein the I/O drive circuit comprises a pulse generation circuit configured to generate a pulse for a predefined time when the data input to the I/O drive circuit is the first pattern of data, the pulse generation circuit comprising:
      a short pulse generation circuit configured to generate a short pulse, a width of the short pulse substantially corresponding to a delay time of a logic gate, the short pulse being generated responsive to a change of the data input to the I/O drive circuit from one of the low level to the high level; and
      a level shift circuit configured to increase a voltage level of the short pulse.

2. The semiconductor memory device of claim 1, wherein the I/O drive circuit is configured to receive an internal voltage through a power node, and wherein the current supply circuit is configured to supply the current to the power node.

3. The semiconductor memory device of claim 2, further comprising a decoupling capacitor (DECAP) disposed between the power node and ground.

4. The semiconductor memory device of claim 3, wherein the current supply circuit comprises a p-channel metal oxide semiconductor (PMOS) transistor, the PMOS transistor including a source coupled to the external voltage, a drain coupled to the power node, and a gate configured to receive the short pulse.

5. An output drive circuit of a semiconductor memory device, the output drive circuit comprising:
   an output circuit configured to receive data from an input node and to output the data to an output pad; and
   a current control circuit configured to control current supplied by an external voltage to the output circuit responsive to a predefined data transition, wherein when the data received by the output circuit changes from a low level to a high level, the output circuit is configured to receive current generated by an external voltage, and wherein the output circuit is configured to receive an internal voltage through a power node and to receive current generated by the external voltage through the power node.

6. The output drive circuit of claim 5, further comprising a decoupling capacitor disposed between the power node and ground.

7. The output drive circuit of claim 6, wherein the current control circuit comprises a short pulse generation circuit configured to output a short pulse, a width of the short pulse substantially corresponding to a delay time of a logic gate, the short pulse being output responsive to a change of the data received by the output drive circuit from one of (a) the high level to the low level and (b) the low level to the high level, the output circuit being configured to receive the current generated by the external voltage responsive to the short pulse.

8. The output drive circuit of claim 7, wherein the short pulse generation circuit comprises:

an inverter configured to invert the data received from the input node; and a NAND gate configured to perform a NAND operation on data received from the input node and data output from the inverter, wherein the output circuit comprises:

a first output circuit configured to receive the data from the input node and to output the data to the output pad; and a second output circuit configured to receive the data from the input node, the second output circuit including a delay circuit to delay the data for a predefined time, and to output the data to the output pad; and wherein the first and second output circuits share the current control circuit.

9. The output drive circuit of claim 5, wherein the predefined data transition includes a change from a low level to a high level.

10. An output drive circuit of a semiconductor memory device, the output drive circuit comprising:

a first output circuit configured to receive data from an input node and to output the data to an output pad;

a second output circuit configured to receive the data from the input node, the second output circuit including a delay circuit to delay the data for a predefined time, and to output the data to the output pad;

a plurality of current supply circuits configured to supply current generated by an external voltage, each current supply circuit being configured to supply the current to one of the first and second output circuits when the data received from the input node has a first pattern, and to prevent the current generated by the external voltage from being supplied to the first and second output circuits when the data received from the input node has a second pattern; and a current control circuit configured to generate a pulse for a predefined time responsive to at least one of the first and second patterns, wherein the plurality of current supply circuits are operable depending on the pulse generated by the current control circuit.

11. The output drive circuit of claim 10, wherein the current control circuit comprises:

a short pulse generation circuit configured to generate a short pulse, a width of the short pulse substantially corresponding to a delay time of a logic gate, the short pulse being generated responsive to a change of the data received from the input node from one of (a) a high level to a low level and (b) the low level to the high level; and a level shift circuit configured to increase a voltage level of the short pulse.

12. The output drive circuit of claim 11, wherein when the data received from the input node changes from the low level to the high level, each of the current supply circuits is configured to supply the current generated by the external voltage to one of the first and second output circuits.

13. The output drive circuit of claim 11, wherein when the data received from the input node has a constant level, each of the current supply circuits is configured to prevent the current generated by the external voltage from being supplied to the first and second output circuits.

14. The output drive circuit of claim 11, wherein when the data received from the input node has a constant level, the first and second output circuits are configured to receive current generated by at least one internal voltage generation circuit.

* * * * *